MANUAL, AUTOMATIC, AND SEMIAUTOMATIC TUNING CIRCUITS
UTILIZING VOLTAGE VARIABLE CAPACITANCE DIODES
Filed Nov. 1, 1966

INVENTOR
Frank L. Pampel.
BY
Mueller, Aichele & Rauner
ATT'YS.

3,440,544
Patented Apr. 22, 1969

3,440,544

MANUAL, AUTOMATIC, AND SEMIAUTOMATIC TUNING CIRCUITS UTILIZING VOLTAGE VARIABLE CAPACITANCE DIODES

Frank L. Pampel, Watseka, Ill., assignor to Motorola, Inc., Franklin Park, Ill., a corporation of Illinois Filed Nov. 1, 1966, Ser. No. 591,200
Int. Cl. H04b *1/16;* H03b *3/04*
U.S. Cl. 325—422 11 Claims

ABSTRACT OF THE DISCLOSURE

A plurality of tuned circuits each comprising a voltage variable capacitance diode in series with a large capacitance DC blocking capacitor. Manual tuning is derived by a variable voltage selectively connected to the diode-capacitor function. AFC is provided by a pair of field effect (FET) transistors connected to the same function whereby the output voltage from a discriminator is applied to the FET transistors for adjusting the DC blocking capacitor voltage. Semi-automatic tuning is provided by a pair of circuits including manual switches respectively connected to the pair of FET transistors.

This invention relates to frequency control circuits, particularly those including a varactor diode for controlling the tuning of a frequency determining portion of a tuned circuit.

Resonant circuits are used in electronic equipment in many applications, such as for tuning radio receivers. Such receivers generally include manual or automatic means for changing the reactance of an element of the tuned circuit to tune from one station or frequency to another. An AFC (automatic frequency control) circuit may be used to control the tuning, and in prior superheterodyne radio receiver circuits, the AFC signal was applied to the oscillator of the radio receiver, for example. Such AFC systems were still subject to some tuning errors caused by drift of other tuned circuits in the receiver.

In electronic systems involving tuned circuits it is also desirable to combine a plurality of functions in a minimum of components, such as combining an AFC circuit with other tuning circuits of a system.

Accordingly, it is an object of this invention to provide an improved AFC system.

It is another object to provide an improved tuning system utilizing voltage variable capacitors.

It is a further object of this invention to provide a combined tuning circuit having AFC, manual tuning and semiautomatic tuning.

It is still another object of this invention to provide a simple frequency controller for tuned circuits.

A feature of the invention is the provision of a plurality of electronic circuits which are connected in cascade to process a signal, each of which is tuned by a voltage variable capacitor such as a varactor diode. Signals are developed within the system indicating variations from a desired frequency, which signals are utilized to automatically retune the tuned circuits through a simple solid state capacitor charge and discharge control circuit which controls the voltage across large capacitors connected to the voltage variable capacitors.

A further feature is the provision of a circuit for adjusting the automatic frequency control portion to automatically adjust the voltage variable capacitance to select an adjacent frequency spectrum or channel. Application of the subject invention to a radio receiver, for example, would include AFC action as well as the other described actions, and is applied to antenna circuits, RF amplifier stages and a mixer-oscillator circuit.

Referring now to the accompanying drawings.

In accordance with this invention, a radio receiver includes tuned circuits having a transformer tuned by a varactor diode connected in series with a large capacitance DC blocking capacitor. The varactor diode capacitance determining voltage is applied to the junction of the DC blocking capacitor and the varactor diode. In addition to preventing the biasing voltage from shorting through the transformer winding of each stage, the DC blocking capacitor stores a voltage charge for reverse biasing the varactor diode to determine its capacitance within the tuned circuit. The blocking capacitor has such a large capacitance that its RF impedance is negligible. For normal manual tuning, a variable voltage is selectively connected to each of the junctions in the various stages. By adjusting the variable voltage applied, the receiver is tuned to different channels. Additionally, AFC is provided by a pair of FET (field effect transistor) circuits respectively connected through high impedances to the same junction. When used in an FM receiver, the output voltage of the FM discriminator thereof can be applied to the FET transistors for adjusting the DC blocking capacitor voltage such that the average output of the discriminator is zero volts. That is, the receiver is tuned to a desired frequency which is the center frequency of the FM radio signal. The invention can be used in an AM receiver by providing a discriminator therewith.

An additional feature is provided by a pair of circuits including manual switches respectively connected to the pair of FET circuits. In an exemplary embodiment, when a switch is closed, the DC blocking capacitor voltage is adjusted an amount corresponding to the frequency separation of adjacent channels, thereby retuning the receiver to an adjacent channel. Each manual switch circuit includes a capacitance for momentarily storing a voltage such that the DC blocking capacitor voltage is adjusted near the adjacent channel even when the switches are but momentarily closed. The AFC action then tunes the circuit more precisely. The manual tuning circuit overrides any AFC action provided by the FET circuit or the manual switch circuits just described.

Figures 1, 2:
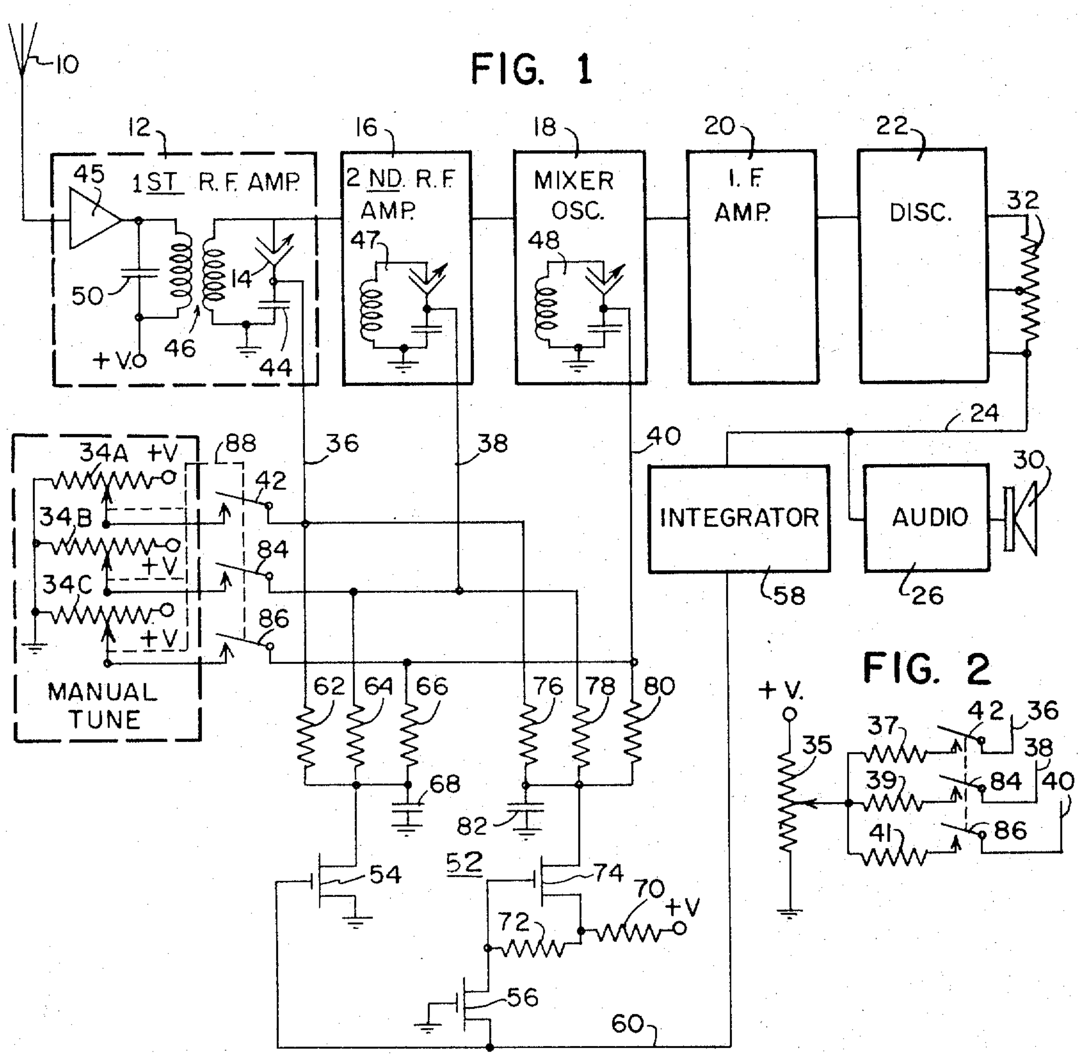
FIG. 1 is a schematic diagram showing one embodiment of this invention as applied to an FM radio receiver.
FIG. 2 shows an alternate embodiment of the circuit of FIG. 1.

An FM receiver embodying the subject invention is illustrated in block form in FIG. 1. Antenna 10 intercepts an FM radio wave and supplies it to the first RF stage 12, which is tuned by voltage variable capacitor 14 as will be later described. Second RF stage 16 further amplifies and supplies the RF wave to mixer-oscillator 18. Mixer-oscillator 18 converts the frequency of the received wave to an IF frequency which is amplified by IF stages 20 and then applied to a known FM discriminator circuit 22. The demodulated signal voltage is developed across discriminator load resistor 32, and is applied over line 24 to audio amplifier stages 26 and thence to speaker 30.

The receiver is manually tuned by a set of three potentiometers 34A, 34B and 34C which are connected respectively over lines 36, 38 and 40 to stages 12, 16 and 18. The setting of potentiometer 34A determines the DC voltage on line 36, whenever switch 42 is closed for manual tuning. Manual tuning is completed when DC blocking capacitor 44 in RF stage 12 is charged to the voltage on line 36. Capacitor 44 has a sufficiently high capacitance that its RF impedance is extremely low with respect to the impedance presented by varactor diode 14. The tuned circuit is completed by the inductance of transformer 46. A signal amplifier 45, which may include a transistor or other semiconductor device, drives transformer 46 in a known manner. Capacitor 50 may be connected across the primary of transformer 46.

The tuning circuits 47 and 48 of stages 16 and 18 are substantially identical to the tuning portions of stage 12. The potentiometers 34B and 34C are connected to the voltage control lines 38 and 40 extending to circuits 47 and 48 through switches 84 and 86 respectively.

Upon completion of manual tuning, switch 42 is opened and the AFC circuit, generally indicated by numeral 52, maintains the voltage across capacitor 44 at the predetermined value for keeping the receiver tuned to the center frequency of the received signal. The AFC circuit includes FET transistors 54 and 56 which are connected to discriminator load resistor 32 for receiving the frequency discriminator output voltage. An integrator 58 may be interposed between line 24 and the FET transistor circuit 52 for averaging the demodulated signal amplitude to zero whenever the receiver is correctly tuned to the received FM wave center frequency to reduce interaction between various tuned circuits. RF bypass capacitors 68 and 82 may be connected to transistors 54 and 56 respectivley as shown.

A deviation in tuning from the desired signal frequency results in an increase in signal voltage across resistor 32. This average increase is integrated and supplied to FET transistor circuit 52 over line 60. A positive voltage, indicating the receiver is tuned to a frequency lower than the desired frequency forward biases FET transistor 54 to current conduction. Current then flows through transistor 54 from the three parallel high-impedance resistors 62, 64 and 66 to respectively discharge DC blocking capacitors in stages 12, 16 and 18, such as capacitor 44 in stage 12. Discharging capacitor 44 in stage 12 reduces the reverse bias across voltage variable capacitor 14 to thereby decrease its capacitance. The decreased capacitance increases the resonant frequency of the tuned circuit including voltage variable capacitor 14 and transformer 46. Such action increases the receiver tuned frequency toward the center frequency of the received FM signal. It may be noted that the positive voltage provided by integrator 58 biases FET transistor 56 further into non-conduction.

A drift of the receiver tuning to a frequency above the center frequency of the received signal results in a negative voltage being provided to line 60. FET transistor 54 is biased further into current non-conduction while transistor 56 is biased to current conduction. Current is then drawn by transistor 56 from voltage source V through resistors 70 and 72. The resulting voltage drop across resistor 72 biases FET transistor 74 to current conduction. Current then flows from source V through resistor 70 and is thence supplied to high impedance parallel resistors 76, 78 and 80, respectively, to charge DC blocking capacitors in stages 12, 16 and 18. For example, charging capacitor 44 in stage 12 increases the reverse bias on voltage variable capacitor 14 to thereby increase its capacitance. The resulting decrease in resonant frequency of the tuned circuit retunes the receiver downwardly towards the center frequency of the received signal.

Manual tuning provided by potentiometers 34 overrides all AFC action of circuit 52. The electrical impedances of potentiometers 34 are small with respect to the impedances of resistors 62, 64, 66, 76, 78 and 80; therefore, when potentiometers 34 are connected to the DC blocking capacitors, the voltages thereacross are determined by the potentiometer settings. The switches 42, 84 and 86 are ganged with the potentiometer control (not shown), as indicated by line 88, and are simultaneously closed whenever the potentiometer control is operated. Alternatively, switches 42, 84 and 86 may be operated independently of the potentiometers 34 as AFC on-off switches.

As shown in FIG. 2, the three potentimoeters 34A, 34B and 34C can be replaced by a single potentiometer 35. A variable voltage provided by the movable tap thereon is applied through isolating resistors 37, 39 and 41, respectively, and through switches 42, 84 and 86 to lines 36, 38 and 40, when the switches are operated. This use of a single potentiometer simplifies the circuit and reduces cost, particularly when a large number of stages are simultaneously controlled. The showing of three stages is only representative, and a different number may be controlled in the manner described.

Figure 3:
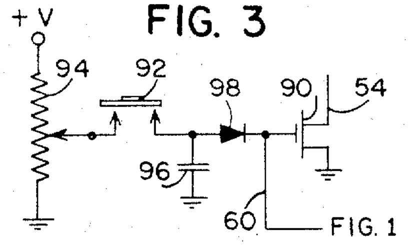
FIG. 3 is a schematic diagram showing a circuit arrangement for automatically shifting from one channel to the next using the FIG. 1 embodiment.
Figure 4:
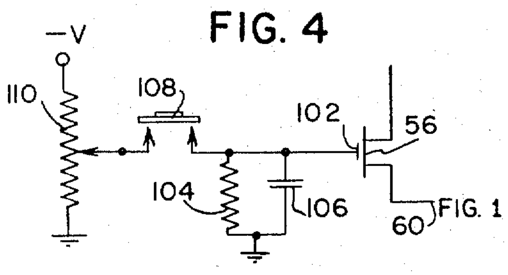
FIG. 4 is an alternate circuit performing a function similar to the circuit illustrated in FIG. 3.

Semi-automatic tuning is provided through circuit 52 by adding a control circuit as shown in the schematic diagrams of FIGS. 3 and 4. In FIG. 3 there is shown a circuit for controlling FET transistor 54 which has its source electrode grounded and receives control signals at its gate electrode 90. Manual control is provided by momentary switch 92 which has one end connected to potentiometer 94 for receiving a positive voltage. Upon closing switch 92, the positive voltage charges capacitor 96 and current flows through diode 98 to forward bias transistor 54 to current conduction for returning the receiver (FIG. 1) to a lower frequency channel. Capacitor 96 is selected such that a momentary closure of switch 92 fully charges it. Upon release of switch 92, capacitor 96 discharges through diode 98 for continuing the forward biasing of transistor 54 for a period of time required to adjust the voltage on capacitor 44 (FIG. 1) for tuning the receiver to an adjacent channel. When switch 92 is open and capacitor 96 has been discharged, diode 98 isolates gate electrode 90 from the just described circuit.

The FIG. 4 diagram shows a semi-automatic control circuit for charging the tuning of the circuit to a higher frequency. Instead of grounding the gate electrode 102 of FET transistor 56, as shown in FIG. 1, it is connected to ground reference potential through resistor 104 and capacitor 106. A negative voltage supplied to line 60 still forward biases transistor 56 to current conduction as described with respect to FIG. 1. Momentary switch 108 is connected to a negative source of voltage —V through potentiometer 110. The closure of switch 108 supplies negative potential to gate electrode 102 for forward biasing transistor 56 to current conduction. Capacitor 106 serves to store the negative voltage charge such that when switch 108 is only momentarily closed, the stored charge keeps transistor 56 forward biased until the receiver has been returned to an adjacent higher frequency channel.

The FIGS. 3 and 4 circuits are convenient for remote tuning. Either circuit may be used alone to permit tuning in only one direction, or the two circuits may be used together to permit tuning in either direction. Continuous automatic tuning may be provided by keeping switch 92 or switch 108 depressed for an extended period of time.

It may be noted that the manual tune potentiometer 34 will operate to override any automatic tuning operation provided through the circuits of FIGS. 3 and 4 in the same manner that the AFC action is overridden. It is to be further noted that upon any momentary closure of switches 92 or 108, the receiver is tuned near an adjacent channel frequency, and the AFC action then precisely tunes the receiver to solidly lock its tuning onto the center frequency of such adjacent channel.

The system of the invention is applicable to any receiver which has a frequency discriminator. When used in an FM receiver, the FM discriminator for deriving the audio signal can also be used in the tuning system. When used in an AM receiver or other receiver which does not have an FM discriminator, a frequency discriminator must be provided for the tuning action.

I claim:

1. In a signal translating device having a plurality of tuned circuits normally operating at a selected frequency but subject to frequency drift, and a discriminator circuit in the device supplying an indication of the tuning of the circuits with respect to the selected frequency, the improvement including in combination, a voltage variable capacitor in each of the tuned circuits for tuning the same, a DC blocking capacitor connected to each of said variable capacitors and each storing a capacitance determining voltage, high impedance circuit means including a plurality of pairs of high impedance resistors, with the resistors of each pair connected respectively to said DC blocking capacitors, and switch means coupled to the discriminator circuit including first and second semiconductive means each connected to one resistor in each pair of resistors, said switch means being responsive to the tuning indication for causing said high impedance circuit means to conduct and cause current flow through said blocking capacitors to alter the voltage thereacross for tuning the tuned circuits to the selected frequency.

2. The combination of claim 1 wherein said high impedance circuit means includes a plurality of pairs of high impedance resistors with the resistors of each pair connected respectively to said DC blocking capacitors, and said switch means includes first and second semiconductive means each connected to one resistor in each pair of resistors.

3. The combination of claim 1 wherein, the indication of the discriminator circuit is a first voltage when the frequency of the tuned circuits is above the selected frequency and a second voltage when the frequency of the tuned circuits is below the selected frequency, said first semiconductive means includes a first field effect transistor having a source electrode connected to a reference potential, a drain electrode connected to one high impedance resistor of each pair, and a gate electrode connected to the discriminator circuit, and being responsive to the first voltage for causing current conduction through such resistors for simultaneously discharging the DC blocking capacitors for retuning the signal translating device, said second semiconductive means includes second and third field effect transistors, with said second transistor having a source electrode connected to the discriminator means and being responsive to said second voltage for causing current conduction therethrough, and a drain electrode connected to impedance means, means connecting said third transistor across said impedance means for biasing said third transistor into current conduction in response to conduction through said second transistor, said third transistor being connected to the other resistor of each respective pair of resistors and supplying current therethrough for charging all said DC blocking capacitors for retuning the signal translating device.

4. The combination of claim 3 further including manual tuning means for setting the frequency of the tuned circuits and having variable voltage supply means including a plurality of portions selectively connectable to said DC blocking capacitors respectively and having electrical impedance small with respect to the impedance of said high impedance circuit such that the capacitance determining voltages of said blocking capacitors are set by said manual tuning means.

5. The combination of claim 3 further including semiautomatic tuning means for retuning the translating device to a frequency other than the selected frequency and comprising, voltage supply means, a momentary switch for connecting said voltage supply means to the gate electrode of said first transistor for selectively biasing the same to conduction, and diode means interposed between said momentary switch and said gate electrode for isolating said first transistor from said semi-automatic tuning means whenever the momentary switch is open.

6. The combination of claim 5 wherein said semiautomatic tuning means includes voltage storage means for adjusting the DC blocking capacitor voltage a predetermined amount when said momentary switch is closed a time shorter than the time required to adjust such voltage said predetermined amount.

7. The combination of claim 3 further including semiautomatic tuning means for returning the device to a frequency other than the selected frequency and comprising, voltage supply means, a resistor connected to the gate electrode of said second transistor and to a reference potential, and a momentary switch selectively connecting said voltage supply means to said gate electrode for selectively biasing the same to current conduction.

8. The combination of claim 7 wherein said semiautomatic tuning means includes voltage storage means for adjusting the DC blocking capacitor voltage a predetermined amount when said momentary switch is closed a time shorter than the time required to adjust such voltage said predetermined amount.

9. A frequency modulation signal translating system capable of translating frequency modulated signals having different center frequencies including in combination, a plurality of tunable circuits connected in casecade to process a frequency modulated signal having a center frequency and which tunable circuits are subject to frequency drift, frequency discriminator means in the system and responsive to the frequency modulated signal translaation to supply first and second indicating signals whenever the circuit frequency tuned by the system has shifted respectively above and below the center frequency of the signal to be translated, a voltage variable capacitor in each tunable circuit for tuning such circuit, a DC blocking capacitor connected to each of said voltage variable capacitors and each storing a capacitance determining voltage, inductance means in each tunable circuit and being connected across said capacitors in series to form the frequency determining portion of such circuit, a first field effect transistor having a source electrode electrically connected to a reference potential and a gate electrode electrically connected to said frequency discriminator means and being responsive to said first indicating signal to conduct current, a plurality of first resistors connected respectively between said first field effect transistor and said DC blocking capacitors for selectively altering the capacitance determining voltage to retune the system such that said first signal is removed, a second field effect transistor having a gate electrode electrically coupled to the reference potential and a source electrode connected to said frequency discriminator means and being responsive to said second signal to conduct current, a third field effect transistor responsively connected to the drain electrode of said second field effect transistor for supplying a charging current in response to conduction of said second transistor, and a plurality of second resistors connected respectively between said third field effect transistor and said DC blocking capacitors for applying charging current thereto for selectively altering the capacitance determining voltage to retune the system such that said second signal is removed.

10. The system of claim 9 further including manual tuning means for setting the frequency of the tunable circuits and having variable voltage supply means including a plurality of portions selectively connected to said DC blocking capacitors respectively, said voltage supply means having electrical impedance small compared to the impedance of said resistors such that the capacitance determining voltages of said blocking capacitors are determined substantially entirely by said voltage supply means of said manual tuning means when connected thereto.

11. The system of claim 9 further including first semi-automatic tuning means for tuning the transmitting device to a frequency lower than the selected frequency including momentary operative switch means for applying a voltage of a first polarity to the gate electrode of said first transistor for selectively biasing the same to conduction to thereby change the capacity determining voltage on said DC blocking capacitors to retune the system to a lower frequency, and second semi-automatic tuning means for tuning the transmitting device to a frequency higher than the selected frequency including second momentary switch means for applying a voltage of polarity opposite to said first polarity to said gate electrode of said second transistor for selectively biasing the same to conduction so that said third transistor applies a voltage to said DC blocking capacitors to retune the system to a higher frequency.

References Cited

UNITED STATES PATENTS

| | | |
|---|---|---|
| 3,233,179 | 2/1966 | Klettke. |
| 3,249,876 | 5/1966 | Harrison. |
| 3,316,498 | 4/1967 | Doble. |

KATHLEEN H. CLAFFY, *Primary Examiner.*

B. P. SMITH, *Assistant Examiner.*

U.S. Cl. X.R.

325—346, 453; 331—36